(12) United States Patent
Wang et al.

(10) Patent No.: US 8,980,113 B2
(45) Date of Patent: Mar. 17, 2015

(54) CHEMICAL MECHANICAL PLANARIZATION USING NANODIAMOND

(75) Inventors: Jun Wang, Shrewsbury, MA (US); Ronald W. Laconto, Leicester, MA (US); Andrew G. Haerle, Sutton, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 468 days.

(21) Appl. No.: 12/723,606

(22) Filed: Mar. 12, 2010

(65) Prior Publication Data

US 2010/0233880 A1  Sep. 16, 2010

Related U.S. Application Data

(60) Provisional application No. 61/159,962, filed on Mar. 13, 2009.

(51) Int. Cl.
| | |
|---|---|
| *C03C 15/00* | (2006.01) |
| *C03C 25/68* | (2006.01) |
| *H01L 21/302* | (2006.01) |
| *H01L 21/461* | (2006.01) |
| *C09K 3/14* | (2006.01) |
| *B24B 37/00* | (2012.01) |
| *C09G 1/02* | (2006.01) |

(Continued)

(52) U.S. Cl.
CPC ............... *C09K 3/1463* (2013.01); *B24B 37/00* (2013.01); *C09G 1/02* (2013.01); *C09K 3/1409* (2013.01); *H01L 21/02024* (2013.01); *H01L 29/1608* (2013.01)
USPC .................. 216/89; 216/88; 216/90; 216/91; 438/690; 438/691; 438/692; 438/693

(58) Field of Classification Search
USPC ............... 216/88–91; 252/79.1; 438/690–693
See application file for complete search history.

(56) References Cited

U.S. PATENT DOCUMENTS

| | | | |
|---|---|---|---|
| 5,861,349 | A | 1/1999 | Vereschagin et al. |
| 5,916,955 | A | 6/1999 | Vereschagin et al. |
| 6,211,089 | B1 | 4/2001 | Kim et al. |

(Continued)

FOREIGN PATENT DOCUMENTS

| | | |
|---|---|---|
| CN | 1378238 A | 11/2002 |
| CN | 1560161 A | 1/2005 |

(Continued)

OTHER PUBLICATIONS

Nanodiamonds.com "Nano Diamonds" Archived on Sep 13, 2008 from Internet Archive Wayback Machine, available at: http://www.nanodiamond.com.ua/NANO.HTM, Archive available from: http://web.archive.org/web/20080913142423/http://www.nanodiamond.com.ua/NANO.HTM.*

(Continued)

*Primary Examiner* — Allan Olsen
*Assistant Examiner* — Margaret D Klunk
(74) *Attorney, Agent, or Firm* — Abel Law Group, LLP; Adam Keser

(57) ABSTRACT

A method for chemical mechanical polishing of a substrate includes polishing the substrate at a stock removal rate of greater than about 2.5 Å/min to achieve a Ra of not greater than about 5.0 Å. The substrate can be a III-V substrate or a SiC substrate. The polishing utilizes a chemical mechanical polishing slurry comprising ultra-dispersed diamonds and at least 80 wt % water.

17 Claims, 2 Drawing Sheets

(51) Int. Cl.
*H01L 21/02* (2006.01)
*H01L 29/16* (2006.01)

(56) References Cited

U.S. PATENT DOCUMENTS

| | | | |
|---|---|---|---|
| 6,242,351 | B1 | 6/2001 | Li et al. |
| 6,258,137 | B1 | 7/2001 | Garg et al. |
| 6,258,721 | B1 * | 7/2001 | Li et al. .................... 438/693 |
| 6,488,767 | B1 | 12/2002 | Xu et al. |
| 6,596,079 | B1 | 7/2003 | Vaudo et al. |
| 6,875,082 | B2 | 4/2005 | Nakayama et al. |
| 6,951,695 | B2 | 10/2005 | Xu et al. |
| 7,118,813 | B2 | 10/2006 | Xu et al. |
| 7,241,206 | B1 | 7/2007 | Sung |
| 2002/0062600 | A1 | 5/2002 | Mandigo et al. |
| 2003/0124850 | A1 | 7/2003 | Minamihaba et al. |
| 2004/0082275 | A1 * | 4/2004 | Mahulikar et al. ............. 451/41 |
| 2005/0093003 | A1 | 5/2005 | Shibata |
| 2005/0150598 | A1 * | 7/2005 | Moeggenborg et al. . 156/345.12 |
| 2006/0029832 | A1 | 2/2006 | Xu et al. |
| 2006/0108325 | A1 | 5/2006 | Everson et al. |
| 2006/0236922 | A1 | 10/2006 | Ishibashi et al. |
| 2007/0039246 | A1 * | 2/2007 | Liu ............................... 51/298 |
| 2007/0231245 | A1 * | 10/2007 | Kumasaka et al. ........... 423/446 |
| 2007/0231978 | A1 | 10/2007 | Kanamoto et al. |
| 2007/0254401 | A1 * | 11/2007 | Nishiura et al. ................ 438/97 |
| 2008/0057608 | A1 | 3/2008 | Ishibashi et al. |
| 2008/0070482 | A1 * | 3/2008 | Yamada et al. ................ 451/36 |
| 2008/0124510 | A1 | 5/2008 | Xu et al. |
| 2008/0139089 | A1 | 6/2008 | Aoki et al. |
| 2008/0188165 | A1 * | 8/2008 | Sakaguchi et al. ........... 451/259 |
| 2008/0303118 | A1 | 12/2008 | Arena et al. |
| 2009/0004092 | A1 | 1/2009 | Dolmatov |
| 2009/0047787 | A1 * | 2/2009 | Li et al. ........................ 438/693 |

FOREIGN PATENT DOCUMENTS

| | | |
|---|---|---|
| CN | 1985306 A | 6/2007 |
| CN | 101335205 A | 12/2008 |
| EP | 1288162 | 5/2003 |
| EP | 1717286 A1 | 11/2006 |
| JP | 08-336739 A | 12/1996 |
| JP | 2000015560 | 1/2000 |
| JP | 2004-331686 A | 11/2004 |
| JP | 2007-075948 A | 3/2007 |
| KR | 20060112232 A | 10/2006 |
| KR | 20090015017 A | 2/2009 |

OTHER PUBLICATIONS

Korets, A. Y. et al. "Molecular structural nonuniformity of ultradispersed diamond-containing material and the reasons why is arises." 2007, Russian Journal of Physical Chemistry B, 1(5), p. 485-492.*

Hanser, D. et al; "Surface Preparation of Substrates from Bulk GaN Crystals"; Elsevier, ScienceDirect, Journal of Crystal Growth 305 (2007) pp. 372-376.

Hayashi, S. et al; "Chemical Mechanical Polishing of GaN"; Journal of The Electrochemical Society, 155 (2) pp. H113-H116 (2008).

Murata, J. et al; "Chemical Planarization of GaN using Hydroxyl Radicals Generated on a Catalyst Plate in H2O2 Solution", Elsevier, ScienceDirect, Journal of Crystal Growth 310 (2008) pp. 1637-1641.

Weyher, J.L. et al; "Chemical Polishing of Bulk and Epitaxial GaN"; Elsevier, Journal of Crystal Growth 182 (1997) pp. 17-22.

Xu, Xueping et al; "Fabrication of GaN Wafers for Electronic and Optoelectronic Devices"; Elsevier, ScienceDirect, Optical Materials 23 (2003) pp. 1-5.

An, Joon-Ho et al; "Effect of Process Parameters on Material Removal Rate in Chemical Mechanical Polishing of 6H-SiC(0001)": Materials Science Forum vols. 600-603 (2009) pp. 831-834.

Tavernier, P.R. et al; "Chemical Mechanical Polishing of Gallium Nitride"; ECS, Electrochemical and Solid-State Letters, 5 (8) pp. G61-G64 (2002).

International Search Report for PCT/US2010/027250 mailed Oct. 13, 2010, 2 pages.

* cited by examiner

CHEMICAL MECHANICAL PLANARIZATION USING NANODIAMOND

CROSS-REFERENCE TO RELATED APPLICATION(S)

The present application claims priority from U.S. Provisional Patent Application No. 61/159,962, filed Mar. 13, 2009, entitled "CHEMICAL MECHANICAL PLANARIZATION USING NANODIAMOND," naming inventors Jun Wang, Ronald W. Laconto, and Andrew G. Haerle, which application is incorporated by reference herein in its entirety.

FIELD OF THE DISCLOSURE

This disclosure, in general, relates to chemical mechanical planarization using nanodiamond.

BACKGROUND

Gallium nitride based structures are recognized as a promising material for short wavelength optoelectronic devices and high-power, high-frequency electronic devices. However, the potential of this material has been limited by the lack of a suitable lattice matched substrate for epitaxially grown device layers. This has led to the development of bulk GaN substrates. With the development of these substrates, surface preparation techniques must also be investigated to provide atomically smooth, damage-free surfaces, such as chemical mechanical planarization (CMP). Additionally, alternative processes that may further expand GaN technologies, including wafer bonding, and layer transfer techniques, often require planarization steps creating a need for a well-controlled GaN CMP process.

CMP uses a combination of chemical and mechanical reactions to remove material leaving a planarized, damage-free surface. Ideally, material removal is achieved by chemically altering the surface to a mechanically weaker form. This material is then abraded from the surface leaving the bulk undisturbed. Planarization occurs due to the acceleration of both mechanical grinding and chemical transformation at the high points. While CMP slurries have been developed to achieve angstrom level surface roughness, a need exists for improved CMP slurries.

SUMMARY

In an aspect, a method for chemical mechanical polishing of a substrate, can include polishing the substrate at a stock removal rate of at least about 2.5 Å/min to achieve an Ra of not greater than about 5 Å. In an embodiment, the substrate can be a III-V substrate, such as gallium nitride (GaN), gallium arsinide (GaAs), or $Al_xGa_yIn_zN$, wherein x+y+z=1. In another embodiment, the substrate can be a SiC substrate. In a particlular embodiment, the stock removal rate can be at least about 15.0 Å/min. In a further embodiment, the Ra can be not greater than about 4.5 Å, such as not greater than about 4.0 Å, even not greater than about 3.5 Å. In another particular embodiment, the Ra as determined by atomic force microscopy ($Ra_{AFM}$) can be not greater than about 1.0 Å. The polishing can utilize a chemical mechanical polishing slurry including ultra-dispersed diamond (UDD) and at last about 80 wt % water.

In another aspect, a chemical mechanical polishing slurry can include at least about 80 wt % water, ultra dispersed diamond (UDD) dispersed within the water, a complexing agent, and a pH modifying agent. The UDD can be present in an amount not greater than about 5 wt %. The complexing agent can be in an amount not greater than about 1000 ppm. The pH modifying agent can be in an amount effective to adjust the pH of the slurry to at least about 8.0.

In a particular embodiment, the UDD is in an amount not greater than about 2.5 wt %, such as not greater than about 1.0 wt %, not greater than about 0.5 wt %, even not greater than about 0.2 wt %. Additionally, the UDD can have a primary particle size of not greater than about 10.0 nm, such as not greater than about 8.0 nm, even not greater than about 6.0 nm. Further, the UDD can have a surface area of between about 150 $m^2/g$ and about 400 $m^2/g$, such as between about 200 $m^2/g$ and about 350 $m^2/g$. Still further, the UDD can include at least about 45 wt % diamond and have a density of between about 2.8 $g/cm^3$ and about 3.0 $g/cm^3$, particularly about 2.9 $g/cm^3$.

In another embodiment, the complexing agent can include organic carboxylic acids, such as citric acid, malic acid, and the like. Further, the complexing agent can be in an amount not greater than about 1000 ppm, such as not greater than about 900 ppm, even not greater than about 800 ppm. Additionally, the complexing agent can be in an amount of at least about 500 ppm, such as at least about 600 ppm, even at least about 700 ppm. In yet another embodiment, the chemical mechanical polishing slurry can further include a passivating agent, such as 1,2,4 triazole. The passivating agent can be in an amount not greater than about 500 ppm, such as not greater than about 400 ppm, even not greater than about 300 ppm. Further, the passivating agent can be in an amount of at least about 50 ppm, such as at least about 100 ppm, even at least about 150 ppm.

In a further embodiment, the pH modifier can include potassium hydroxide and can be in an amount effective to adjust the chemical mechanical polishing slurry to a pH of at least about 8.0, such as at least about 9.0, at least about 10.0, even at least about 11.0.

In yet another embodiment, the chemical mechanical polishing slurry further can include an oxidizer, such as sodium hypochlorite, hydrogen peroxide, ammonium persulfate, and the like. The oxidizer can be in an amount not greater than about 10 wt %, such as not greater than about 7.5 wt %, not greater than about 5.0 wt %, even not greater than about 2.5 wt %.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Figure 1:
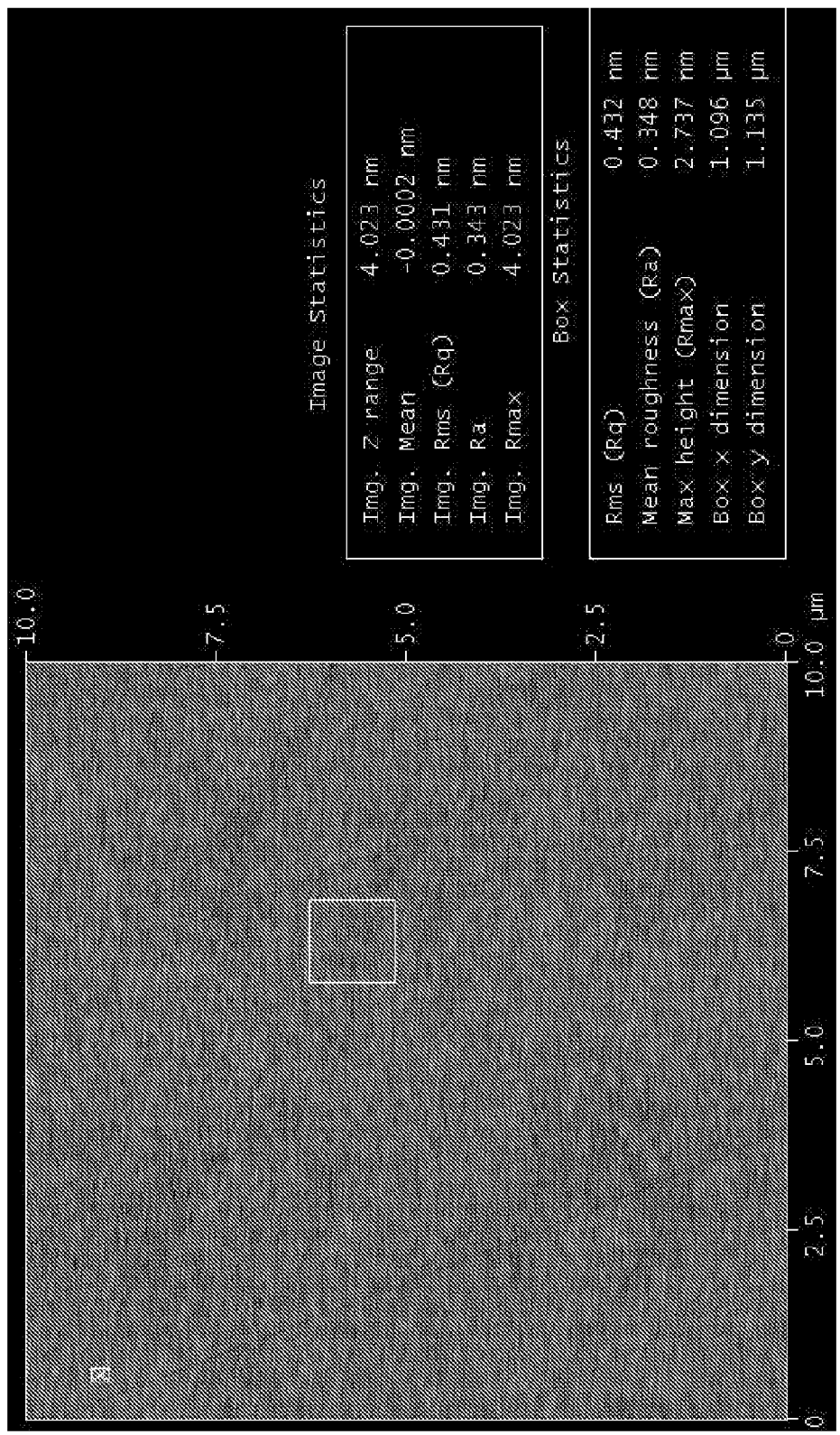
FIGS. 1-2 are illustrative images of atomic force microscopy of gallium nitride substrates after chemical mechanical polishing.

In one particular embodiment, the disclosure is directed to a water based slurry for chemical mechanical polishing of a substrate. The water based slurry can include at least about 80 wt % water, such as at least about 85 wt % water, at least about 90 wt % water, even at least about 95 wt % water. The CMP slurry can include ultra dispersed diamond (UDD) dispersed in water in an amount not greater than about 5 wt %, such as not greater than about 2.5 wt %, even not greater than about 1 wt %. In an embodiment, the UDD can be in an amount not greater than about 0.5 wt %, even not greater than about 0.2 wt %, but generally greater than about 0.01 wt %. The CMP slurry can also include a complexing agent and a pH modifying agent. The complexing agent can be present in the slurry in an amount not greater than about 1000 ppm, such as not greater than about 900 ppm, even not greater than about 800 ppm. Additionally, the complexing agent can be in an amount of at least about 500 ppm, such as at least about 600 ppm, even at least about 700 ppm. The pH modifying agent can be effective to adjust the pH of the slurry to a pH of at least about 8.0, such as at least about 9.0, at least about 10.0, even at least about 11.0.

Oil based CMP slurries using nano-sized diamond abrasives have been developed. However, the inventors have recognized that oil based slurries and certain aqueous slurries are not applicable to CMP polishing systems utilizing a polishing pad, as the oil has a tendency to break down the pad adhesive, significantly reducing the life of the polishing pad. As an example, US 2008/0139089 discloses UDD in oil-based and water/glycol-based slurries. These slurries would not be suitable for use with a polishing pad. Specifically, the oil or the ethylene glycol would act to break down the pad adhesive, reducing the life of the polishing pad. Additionally, water based slurries, particularly slurries having a water content of at least about 80 wt %, are desirable due to the easier handling, reduced manufacturing costs, and reduced disposal requirements to mitigate any adverse environmental impact compared to oil based slurries or slurries containing ethylene glycol. In addition, many CMP slurries require oxidizers to achieve the very best surface finishes, and oxidizers in general are not compatible with oil based formulations.

As defined herein, UDD refers to synthetic diamond-containing particles produced using a detonation method (also known as a shockwave method). In an embodiment, graphite powders can be used as the material for diamond. The graphite powder can be compressed at a high temperature by providing a shock with the energy of explosion to thereby generating the UDD material. In another embodiment, an explosive such as TNT or RDX can be detonated and the carbon within the explosive can be converted into diamond by the shock caused by the energy of explosion.

The physical properties of the UDD material can depend on the method of formation. The UDD particles can have a relatively small primary particle size of not greater than about 10.0 nm. Particularly, the particle can be not greater than about 8.0 nm, even not greater than about 6.0 nm. Generally, the primary particle size can be greater than about 2.0 nm. The primary particles can be aggregated into clusters having an average size of between about 50 nm and about 1000 nm, such as between about 100 nm and about 500 nm. Further, the UDD material can have a surface area of between about 150 $m^2/g$ to about 400 $m^2/g$, such as between about 200 $m^2/g$ to about 350 $m^2/g$. Additionally, the UDD can have a density of between about 2.8 $g/cm^3$ and about 3.0 $g/cm^3$, particularly about 2.9 $g/cm^3$.

In an embodiment, the UDD material can flocculate within the slurry. The flocculated particles can have a flocculate size of between about 1500 and about 2500 nm, such as about 1900 nm.

Typically, the UDD material can contain diamond phase carbon and non-diamond phase carbon. The non-diamond phase carbon can include graphite, amorphous carbon, onion carbon, or any combination thereof. The UDD material can have at least about 30 wt % diamond phase carbon, such as at least about 40 wt % diamond phase carbon, even at least about 45 wt % diamond phase carbon. Typically, the UDD material can have at least about 3 wt % non-diamond phase carbon and not greater than about 97 wt % diamond phase carbon, such as not greater than about 95 wt % diamond phase carbon, even not greater than about 93 wt % diamond phase carbon.

In contrast, monodiamond (MB 80 commercially available from Saint-Gobain Warren-Amplex Superabrasives) can include greater than about 98 wt % diamond phase carbon. Additionally, the monodiamond can have a surface area of less than about 95 $m^2/g$ and a density of 3.4 $g/cm^3$.

CMP can rely upon a chemical reaction to weaken the surface of the substrate to aid in the removal of high spots on the wafer. The rate of the chemical reaction can depend on the pH of the slurry. The pH modifying agent can include a strong acid, such as HCl, $H_2SO_4$, and $HNO_3$, or a strong base, such as KOH or NaOH, depending on the initial chemical composition of the slurry and the desired final pH. Additionally, the pH modifying agent can include weak acids, such as organic acids, or weak bases. In an embodiment, the pH modifying agent, such as a strong base, can be added to the slurry to increase the pH of the slurry to at least about 8.0, such as at least about 9.0, at least about 10.0, even at least about 11. Alternatively, the pH of the slurry can be not greater than about 6.9, such as not greater than about 5.0, even not greater than about 3.0.

The complexing agent, including glycine, EDTA and organic carboxylic acids such as citric acid, malic acid, tartaric acid, and lactic acid, can be added to the slurry to accelerate the dissolution of small particles polished off from the wafer surface. The complexing agent can prolong the lifetime of the pad, increase the consistency of stock removal rates, and reduce surface scratches. In an embodiment, the complexing agent can be in an amount of not greater than about 1000 ppm, such as not greater than about 900 ppm, even not greater than about 800 ppm. Additionally, the complexing agent, when present, can be in an amount of at least about 500 ppm, such as at least about 600 ppm, even at least about 700 ppm.

In another embodiment, the slurry can further include an oxidizer, such as hydrogen peroxide, ammonium persulfate, NaClO, or the like. The oxidizer can be in an amount of not greater than about 10 wt %, such as not greater than about 7.5 wt %, not greater than 5.0 wt %, even not greater than about 2.5 wt %. Typically, when present, the oxidizer can be in an amount of at least about 0.1 wt %, such as at least about 0.5 wt %, even at least about 1.0 wt %. The oxidizer can act to oxidize the substrate to aid in the removal of surface material. In yet another embodiment, the slurry may also include a passivating agent, such as benzotriazole or 1,2,4 triazole. The passivating agent can be in an amount not greater than about 500 ppm, such as not greater than about 400 ppm, even not greater than about 300 ppm. Further, when the passivating agent is present, the passivating agent can be in an amount of at least about 50 ppm, such as at least about 100 ppm, even at least about 150 ppm.

Turning to a method of using the slurry, a substrate can be provided. The substrate can be an III-V substrate or a SiC substrate. The III-V substrate can include a group III element, such as Al, Ga, and In, and a group V element, such as N and As. By way of example, the III-V substrate can include GaN, AlN, GaAs, and $Al_xGa_yIn_zN$ where $x+y+z=1$. In an embodiment, the substrate may be used, after polishing, for epitaxial growth of additional layers, such as additional layers of GaN. Accordingly, the surface of the substrate should be relatively smooth and free from defects. The surface roughness can have various measures such as Rmax, Ra, Rz, Ry, Rms, and the like. Herein, Ra is employed as an index of surface roughness. It is obtained as an average of absolute values of differences between high and low points formed on the wafer surface. In an embodiment, a surface can be sufficiently smooth for the epitaxial growth of additional layers when the Ra is not greater than about 5 angstroms. Further, the Ra of the surface can be not greater than about 3.5 angstroms. Typically, the Ra is measured optically using an interferometer. However, below a few angstroms, Ra may be determined more accurately using atomic force microscopy. When measured using atomic force microscopy, the $Ra_{AFM}$ can be less than about 1.0 angstrom.

The substrate can be polished using the polishing slurry until the desired surface roughness is achieved. For example, the substrate may be polished for at least about 1.0 hour to achieve the desired surface roughness. Generally, the desired surface roughness can be achieved when polishing for not greater than about 15.0 hrs, such as not greater than about 12.0 hours, even not greater than about 9.0 hours.

EXAMPLES

Sample slurries are prepared and tested to determine a stock removal rate and surface roughness. GaN Surface Rating and GaN Removal Rating are measured using the following standardized procedure. A 2-inch bulk GaN wafer is polished for 60 minutes using a Strasbaugh 6BK 16" single sided polisher using an IC-1000 pad by Eminess Technologies. The polishing is operated at 50 rpm and a pressure of 1.4 psi. Slurry is applied at a drip rate of 22 mL/min. The weight of the GaN wafer is measured before and after polishing. The GaN Removal Rating is determined by calculating a volume of GaN removed based on the mass difference and a density of GaN of 6.1 g/cm³. The volume of GaN removed is assumed to be a cylinder having a radius of 1 inch. The GaN Removal Rating is determined by taking the height of the cylinder and dividing by the time (60 minutes). GaN Surface Rating is determined by averaging the Ra over five different random points using a Zygo New View 100. The Zygo New View 100 uses a 40× objective. Ra is obtained by automatically averaging 5 scans with the same scan size of 0.168 mm×0.126 mm. The results are shown in Table 1. Ra is also determined using atomic force microscopy by taking an average over three different random points.

For example, Sample 1 is prepared by adding 6 wt % alpha $Al_2O_3$ (92910.1MIC commercially available from Saint-Gobain), 6 wt % NaClO, and 0.18 wt % citric acid to deionized water to form a slurry. The pH of the slurry is adjusted to pH 11.0 using KOH.

Sample 2 is prepared as Sample 1, except 0.86 wt % citric acid is added and the pH is adjusted to 9.0 using KOH.

Sample 3 is prepared by adding 6 wt % alpha $Al_2O_3$, and 6 wt % $H_2O_2$ to deionized water, resulting in a slurry having a pH of 3.0.

Sample 4 is prepared as Sample 3, except 12 wt % alpha $Al_2O_3$ is added.

Sample 5 is prepared as Sample 3, except the pH is adjusted to 10.0 using KOH.

Sample 6 is prepared as Sample 1, except 6 wt % transition $Al_2O_3$ (9297-50 NMS with average particle size of 50 nm commercially available from Saint-Gobain) and 0.06 wt % citric acid is added and the pH is adjusted to 11.0 using KOH.

Sample 7 is prepared by adding 0.2 wt % UDD (UDDK 5 NM DIA SOL commercially available from Saint-Gobain Warren-Amplex Superabrasives), 2.5 wt % NaClO, 875 ppm citric acid, and 200 ppm 1,2,4 triazole to deionized water to form a slurry. The pH is adjusted to pH 11.4 using KOH. The $Ra_{AFM}$ is 3.4 Å as shown in FIG. 1.

Sample 8 is prepared as Sample 7, except 0.2 wt % mono diamond (MB 80 NM DIA SOL commercially available from Saint-Gobain Warren-Amplex Superabrasives) is added.

Sample 9 is prepared as Sample 7, except 0.2 wt % poly diamond (SPD-IZ 80 NM commercially available from Saint-Gobain Warren-Amplex Superabrasives) is added.

Sample 10 is prepared as Sample 7, except 0.4 wt % alpha $Al_2O_3$ is added.

Sample 11 is prepared as Sample 7, except 0.4 wt % $SiO_2$ (HT-50 commercially available from Dupont) is added.

Sample 12 is prepared by adding 2.5 wt % $SiO_2$ to deionized water to form a slurry. The pH is adjusted to pH 2.5 using $HNO_3$.

Sample 13 is prepared as Sample 12, except the pH is adjusted to pH 11.0 using KOH.

Sample 14 is prepared as Sample 12, except the pH is adjusted to pH 2.5 using malic acid.

Sample 15 is prepared by adding 0.2 wt % UDD (UDDK 5 NM DIA SOL commercially available from Saint-Gobain Warren-Amplex Superabrasives) to deionized water resulting in a slurry having a pH of 3.4.

Sample 16 is prepared as Sample 15, except 875 ppm citric acid is added and the pH is adjusted to pH 11.0 using KOH.

Sample 17 is prepared as Sample 16, except 200 ppm 1,2,4 triazole is added.

Sample 18 is prepared as Sample 8, except 2.5 wt % ammonium persulfate is added instead of the sodium hypochlorite and the pH is adjusted to 11 with KOH.

Sample 19 is prepared as Sample 18, except the pH is unadjusted at a pH of 2.6.

Sample 20 is prepared as Sample 19, except 2.5 wt % hydrogen peroxide is added instead of the ammonium persulfate.

Sample 21 is prepared as Sample 17, except the 2.5 wt % ammonium persulfate is added to the slurry.

Sample 22 is prepared as Sample 21, except the pH is adjusted to pH 8.0 using KOH.

Sample 23 is prepared as Sample 21, except the pH is unadjusted at a pH of 2.6.

Figure 2:
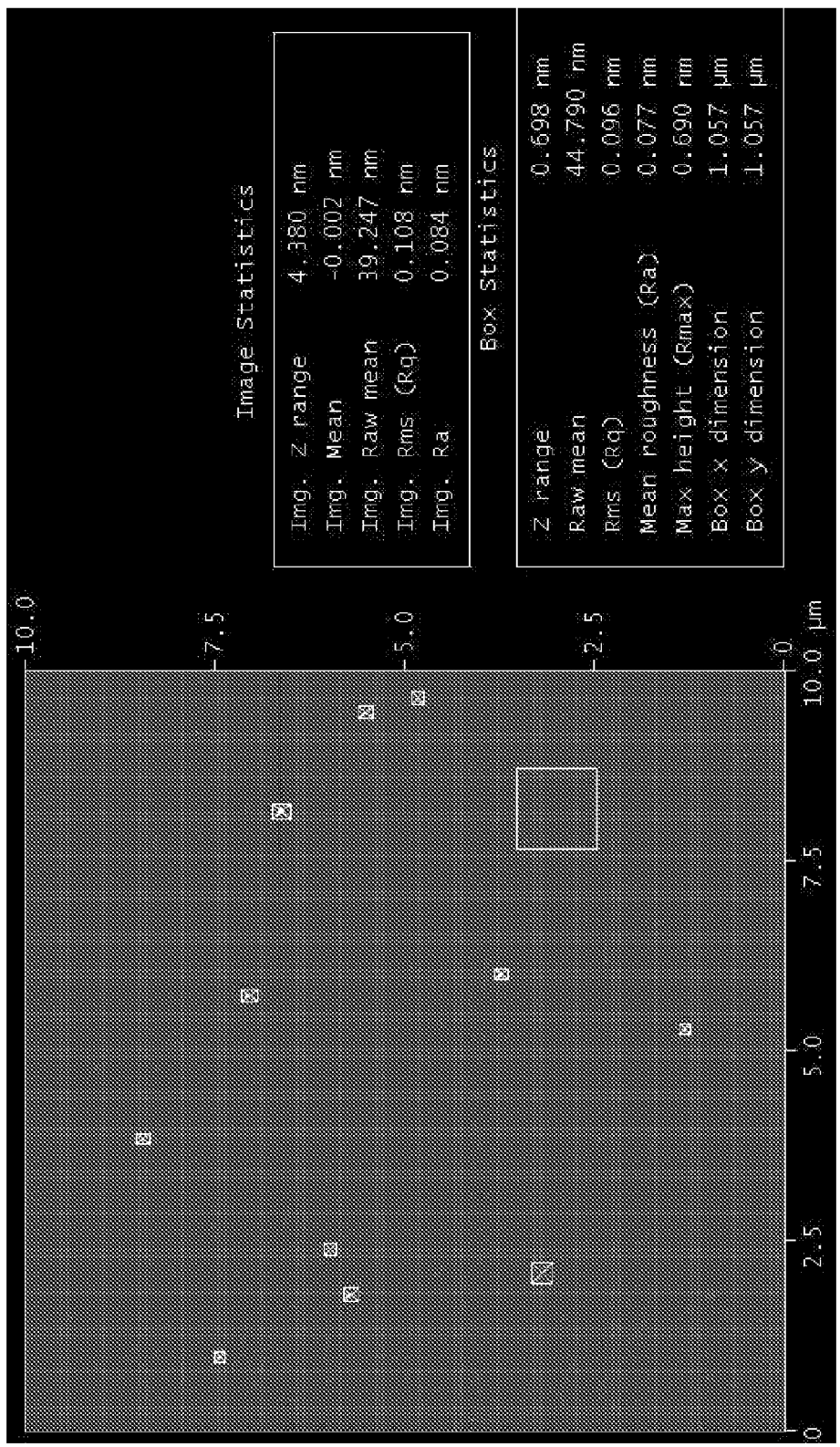

Sample 24 is prepared as Sample 23, except 2.5 wt % hydrogen peroxide is added instead of the ammonium persulfate. The $Ra_{AFM}$ is 0.8 Å as shown in FIG. 2.

Sample 25 is prepared as Sample 24, except 5 wt % $SiO_2$ (Nexsil 85A commercially available from Nyacol) is added instead of the nanodiamond.

Sample 26 is a commercially available chemical mechanical polishing slurry including both nanodiamond and $SiO_2$ particles (Fullaron M3D SWM3D000250005M from NanoCompound).

Samples 27-29 are prepared by adding 0.2 wt % UDD (UDDK 5 NM DIA SOL commercially available from Saint-Gobain Warren-Amplex Superabrasives), 875 ppm citric acid, and 200 ppm 1,2,4 triazole to deionized water to form a slurry, and adjusting the pH of the slurry to pH 11.0 using KOH.

Sample 30 is prepared by adding 0.2 wt % UDD (UDDK 5 NM DIA SOL commercially available from Saint-Gobain Warren-Amplex Superabrasives), 875 ppm citric acid, and 200 ppm 1,2,4 triazole to deionized water to form a slurry. The pH of the slurry is unadjusted at a pH of 2.6.

TABLE 1

|  | GaN Removal Rating (Å/min) | GaN Surface Rating (Å) |
| --- | --- | --- |
| Sample 1 | 38.8 | 59.7 |
| Sample 2 | 9.5 | 78.0 |
| Sample 3 | 17.5 | 47.4 |
| Sample 4 | 16.1 | 80.5 |

TABLE 1-continued

|  | GaN Removal Rating (Å/min) | GaN Surface Rating (Å) |
|---|---|---|
| Sample 5 | 27.0 | 61.0 |
| Sample 6 | 0.0 | 47.6 |
| Sample 7 | 16.1 | 4.1 |
| Sample 8 | 54.3 | 11.2 |
| Sample 9 | 37.8 | 17.8 |
| Sample 10 | 4.0 | 43.0 |
| Sample 11 | 4.7 | 19.6 |
| Sample 12 | 6.8 | 17.6 |
| Sample 13 | 1.4 | 24.3 |
| Sample 14 | 0.0 | 6.0 |
| Sample 15 | 9.5 | 10.3 |
| Sample 16 | 16.1 | 4.9 |
| Sample 17 | 15.5 | 4.6 |
| Sample 18 | 56.9 | 13.1 |
| Sample 19 | 18.9 | 13.9 |
| Sample 20 | 20.6 | 14.1 |
| Sample 21 | 17.7 | 3.6 |
| Sample 22 | 16.1 | 4.8 |
| Sample 23 | 15.8 | 3.5 |
| Sample 24 | 30.1 | 3.5 |
| Sample 25 | 3.4 | 7.1 |
| Sample 26 | 10.4 | 52.0 |
| Sample 27 | 16.3 | 4.6 |
| Sample 28 | 64.3 | 4.3 |
| Sample 29 | 24.7 | 3.9 |
| Sample 30 | 54.0 | 3.7 |

While the invention has been illustrated and described in the context of specific embodiments, it is not intended to be limited to the details shown, since various modifications and substitutions can be made without departing in any way from the scope of the present invention. For example, additional or equivalent substitutes can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

What is claimed is:

1. A chemical mechanical polishing slurry for polishing a GaN substrate, comprising:
   at least 80 wt % water;
   ultra dispersed diamond (UDD) dispersed within the water, the UDD being present in an amount of at least 0.01 wt % and not greater than 5 wt % and having an average primary particle size not greater than 10.0 nm, a density of between 2.8 g/cm$^3$ and 3.0 g/cm$^3$ and a surface area between about 200 m$^2$/g to 350 m$^2$/g;
   a complexing agent in an amount of at least about 500 ppm and not greater than 1000 ppm; and
   a passivating agent in an amount of at least 50 ppm and not greater than 500 ppm,
   wherein the chemical mechanical polishing slurry is capable of polishing the GaN substrate with a removal rate of at least about 15 Å/min while achieving a GaN surface roughness Ra of not greater than about 4.5 Å.

2. The chemical mechanical polishing slurry of claim 1, wherein the chemical mechanical polishing slurry is free of silica particles.

3. The chemical mechanical polishing slurry of claim 1, wherein the passivating agent includes 1,2,4 triazole.

4. The chemical mechanical polishing slurry of claim 1, wherein the complexing agent includes citric acid.

5. The chemical mechanical polishing slurry for polishing a GaN substrate of claim 1, wherein the pH of the slurry is not greater than about 5.0.

6. A chemical mechanical polishing slurry for polishing a GaN substrate comprising:
   at least 80 wt % water;
   ultra dispersed diamond (UDD) dispersed within the water, the UDD being present in an amount of at least 0.01 wt % and not greater than 5 wt % and having an average primary particle size not greater than 10.0 nm, a density of between 2.8 g/cm$^3$ and 3.0 g/cm$^3$ and a surface area between about 200 m$^2$/g to 350 m$^2$/g;
   an oxidizer in an amount of at least 0.1 wt % and not greater than 10 wt %;
   a complexing agent in an amount of at least 500 ppm and not greater than 1000 ppm; and
   a passivating agent in an amount of at least agent 50 ppm and not greater than 500 ppm, wherein the chemical mechanical polishing slurry is capable of polishing the GaN substrate with a removal rate of at least about 15 Å/min while achieving a GaN surface roughness Ra of not greater than about 4.5 Å.

7. The chemical mechanical polishing slurry of claim 6, wherein the chemical mechanical polishing slurry is free of silica particles.

8. The chemical mechanical polishing slurry of claim 6, wherein the passivating agent includes 1,2,4 triazole.

9. The chemical mechanical polishing slurry of claim 6, wherein the oxidizer includes sodium hypochlorite, ammonium persulfate, or hydrogen peroxide.

10. The chemical mechanical polishing slurry of claim 6, wherein the complexing agent includes citric acid.

11. The chemical mechanical polishing slurry for polishing a GaN substrate of claim 6, wherein the pH of the slurry is not greater than about 5.0.

12. A method for chemical mechanical polishing of a III-V substrate, comprising:
    applying a chemical mechanical polishing slurry and a polishing pad to a surface of the III-V substrate, wherein the chemical mechanical polishing slurry comprises ultra-dispersed diamonds (UDD), a complexing agent, a passivating agent, and at least 80 wt % water, and the UDD has an average primary particle size not greater than 10.0 nm, a density of between 2.8 g/cm$^3$ and 3.0 g/cm$^3$ and a surface area between about 200 m$^2$/g to 350 m$^2$/g; and
    polishing the surface of the III-V substrate with the chemical mechanical polishing slurry and the polishing pad at a stock removal rate of at least about 15.0 Å/min to achieve a surface roughness Ra of not greater than about 4.5 Å.

13. The method for chemical mechanical polishing of claim 12, wherein the slurry further comprises an oxidizing agent selected from the group consisting of hydrogen peroxide, ammonium persulfate and sodium hypochlorite in an amount of at least 0.1 wt % and not greater than 10 wt %.

14. The chemical mechanical polishing slurry of claim 12, wherein the passivating agent is included in an amount of at least 50 ppm and not greater than 500 ppm.

15. The chemical mechanical polishing slurry of claim 12, wherein the complexing agent is included in an amount of at least 500 ppm and not greater than 1000 ppm.

16. The method for chemical mechanical polishing of claim 12, wherein the III-V substrate includes GaN, AlN, Ga, As, or $Al_xGa_yIn_zN$ where x+y+z=1.

17. The method for chemical mechanical polishing of a III-V substrate of claim 12, wherein the pH of the slurry is not greater than about 5.0.

* * * * *